United States Patent
Chang

(10) Patent No.: US 12,543,341 B2
(45) Date of Patent: Feb. 3, 2026

(54) TRANSISTOR STRUCTURE HAVING A CHARGE STORAGE LAYER ARRANGED BETWEEN A FIELD PLATE AND A DRIFT REGION

(71) Applicant: Powerchip Semiconductor Manufacturing Corporation, Hsinchu (TW)

(72) Inventor: Jih-Chien Chang, Taoyuan (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 360 days.

(21) Appl. No.: 18/449,712

(22) Filed: Aug. 15, 2023

(65) Prior Publication Data
US 2025/0015180 A1    Jan. 9, 2025

(30) Foreign Application Priority Data
Jul. 3, 2023   (TW) .................. 112124696

(51) Int. Cl.
  *H10D 30/65* (2025.01)
  *H10D 62/13* (2025.01)
  *H10D 64/00* (2025.01)

(52) U.S. Cl.
  CPC .......... *H10D 30/65* (2025.01); *H10D 64/111* (2025.01); *H10D 64/118* (2025.01); *H10D 62/159* (2025.01)

(58) Field of Classification Search
  CPC ........ H10D 30/0281–0289; H10D 30/65–659; H10D 64/111–118
  See application file for complete search history.

(56) References Cited

U.S. PATENT DOCUMENTS

| | | | | |
|---|---|---|---|---|
| 10,692,969 | B1* | 6/2020 | Lin | ....................... H10D 30/605 |
| 11,515,398 | B2* | 11/2022 | Kuo | ................... H10D 30/0221 |
| 2014/0187012 | A1 | 7/2014 | Mitra et al. | |
| 2019/0288112 | A1* | 9/2019 | Wang | ..................... H10D 30/65 |
| 2020/0373395 | A1* | 11/2020 | Ho | ........................ H01L 21/765 |

(Continued)

FOREIGN PATENT DOCUMENTS

TW          201138100          11/2011

OTHER PUBLICATIONS

I. Cortés et al., "A numerical study of field plate configurations in RF SOI LDMOS transistors", Solid-State Electronics, Feb. 2006, pp. 155-163, vol. 50, No. 2.

(Continued)

*Primary Examiner* — Younes Boulghassoul
(74) *Attorney, Agent, or Firm* — JCIPRNET

(57) ABSTRACT

A transistor structure including a substrate, a gate structure, a first doped region, a second doped region, a drift region, a field plate, a charge storage layer, and a first dielectric layer is provided. The gate structure is located on the substrate. The first doped region and the second doped region are located in the substrate on two sides of the gate structure. The drift region is located in the substrate between the gate structure and the second doped region. The field plate is located on the substrate above the drift region. The charge storage layer is located between the field plate and the drift region. The first dielectric layer is located between the field plate and the charge storage layer.

19 Claims, 2 Drawing Sheets

(56) References Cited

U.S. PATENT DOCUMENTS

| | | | |
|---|---|---|---|
| 2021/0376097 A1* | 12/2021 | Goto | H10D 30/0285 |
| 2022/0416031 A1 | 12/2022 | Yoshitsugu et al. | |
| 2023/0268437 A1* | 8/2023 | Chang | H10D 84/83 |
| | | | 257/319 |
| 2024/0145553 A1* | 5/2024 | Koshimizu | H10D 30/65 |
| 2024/0321973 A1* | 9/2024 | Yang | H10D 30/0281 |

OTHER PUBLICATIONS

Siyang Liu et al., "Hot-Carrier-Induced Degradations and Optimizations for Lateral DMOS Transistor With Multiple Floating Poly-Gate Field Plates", IEEE Transactions On Electron Devices, Aug. 2017, pp. 3275-3281, vol. 64, No. 8.

Jun-Ichi Matsuda et al., "Low Switching Loss and Scalable 20-40 V LDMOS Transistors with Low Specific On-Resistance", Proceedings of International Conference on Technology and Social Science 2018 (ICTSS 2018), Apr. 18-20, 2018, pp. 1-8.

Gerhard Klimeck, "ECE606: Solid State Devices Lecture 19 Bipolar Transistors Design", Lecture Notes for Purdue University, Sep.-Nov. 2012, pp. 1-23.

"Office Action of Taiwan Counterpart Application", issued on Aug. 26, 2024, p. 1-p. 6.

\* cited by examiner

TRANSISTOR STRUCTURE HAVING A CHARGE STORAGE LAYER ARRANGED BETWEEN A FIELD PLATE AND A DRIFT REGION

CROSS-REFERENCE TO RELATED APPLICATION

This application claims the priority benefit of Taiwan application serial no. 112124696, filed on Jul. 3, 2023. The entirety of the above-mentioned patent application is hereby incorporated by reference herein and made a part of this specification.

BACKGROUND

Technical Field

The invention relates to a semiconductor structure, and particularly relates to a transistor structure.

Description of Related Art

The transistor device is widely used in various electronic products. With the advancement of technology, the size of the electronic device continues to shrink, so it becomes more difficult to improve the electrical performance of the transistor device. Therefore, how to improve the electrical performance of the transistor device is the goal of continuous efforts.

SUMMARY

The invention provides a transistor structure, which can have better electrical performance.

The invention provides a transistor structure, which includes a substrate, a gate structure, a first doped region, a second doped region, a drift region, a field plate, a charge storage layer, and a first dielectric layer. The gate structure is located on the substrate. The first doped region and the second doped region are located in the substrate on two sides of the gate structure. The drift region is located in the substrate between the gate structure and the second doped region. The field plate is located on the substrate above the drift region. The charge storage layer is located between the field plate and the drift region. The first dielectric layer is located between the field plate and the charge storage layer.

According to an embodiment of the invention, the transistor structure may further include a second dielectric layer. The second dielectric layer is located between the charge storage layer and the substrate.

According to an embodiment of the invention, in the transistor structure, the charge storage layer may be in direct contact with the substrate.

According to an embodiment of the invention, in the transistor structure, the material of the charge storage layer may be a charge trapping material or a floating gate material.

According to an embodiment of the invention, in the transistor structure, the charge trapping material is, for example, silicon nitride or a high dielectric constant (high-k) material.

According to an embodiment of the invention, in the transistor structure, the floating gate material is, for example, doped polysilicon, undoped polysilicon, or a combination thereof.

According to an embodiment of the invention, in the transistor structure, the gate structure may include a gate and a gate dielectric layer. The gate is located on the substrate. The gate dielectric layer is located between the gate and the substrate.

According to an embodiment of the invention, in the transistor structure, the field plate may be located on the substrate between the gate structure and the second doped region.

According to an embodiment of the invention, in the transistor structure, the material of the field plate is, for example, copper (Cu) or aluminum (Al).

According to an embodiment of the invention, in the transistor structure, a portion of the drift region may be located directly below the gate structure.

According to an embodiment of the invention, in the transistor structure, the drift region may be connected to the second doped region.

According to an embodiment of the invention, the transistor structure may further include a bulk region. The bulk region is located in the substrate on one side of the first doped region away from the gate structure.

According to an embodiment of the invention, in the transistor structure, the bulk region may be connected to the first doped region.

According to an embodiment of the invention, in the transistor structure, the first doped region may have a first conductivity type. The bulk region may have a second conductivity type.

According to an embodiment of the invention, the transistor structure may further include a first well region and a second well region. The first well region is located in the substrate. The second well region is located in the substrate on one side of the first well region. The first doped region may be located in the first well region. The second doped region may be located in the second well region. The drift region may be located in the first well region and the second well region.

According to an embodiment of the invention, in the transistor structure, the second well region may be connected to the first well region.

According to an embodiment of the invention, in the transistor structure, the interface between the first well region and the second well region may be located in the substrate between the field plate and the second doped region.

According to an embodiment of the invention, the transistor structure may further include a third well region. The third well region is located in the substrate. The first well region and the second well region may be located in the third well region.

According to an embodiment of the invention, in the transistor structure, the first doped region, the second doped region, the drift region, the second well region, and the third well region may have a first conductivity type. The first well region may have the second conductivity type.

According to an embodiment of the invention, the transistor structure may further include a second dielectric layer. The second dielectric layer is located on the substrate, the gate structure, the field plate, the charge storage layer, and the first dielectric layer.

Based on the above description, in the transistor structure according to the invention, the charge storage layer is located between the field plate and the drift region. Therefore, the charge storage layer can be negative potential by a program operation. In addition, the charge storage layer can be positive potential by an erase operation. In some embodiments, when the transistor structure is an N-type metal oxide semiconductor (NMOS) transistor structure and the charge storage layer is negative potential, the breakdown voltage of the transistor structure can be increased. In some embodiments, when the transistor structure is an NMOS transistor structure and the charge storage layer is positive potential, the on-current of the transistor structure can be increased or the on-resistance of the transistor structure can be reduced. In some embodiments, when the transistor structure is a P-type metal oxide semiconductor (PMOS) transistor structure and the charge storage layer is negative potential, the on-current of the transistor structure can be increased or the on-resistance of the transistor structure can be reduced. In some embodiments, when the transistor structure is a PMOS transistor structure and the charge storage layer is positive potential, the breakdown voltage of the transistor structure can be increased. In this way, the electrical performance of the transistor structure can be improved by the charge storage layer. On the other hand, the transistor structure can be switched between the higher breakdown mode and the higher on-current mode.

In order to make the aforementioned and other objects, features and advantages of the invention comprehensible, several exemplary embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. In fact, the dimensions of the various features may be arbitrarily increased or reduced for clarity of discussion.

Figure 1:
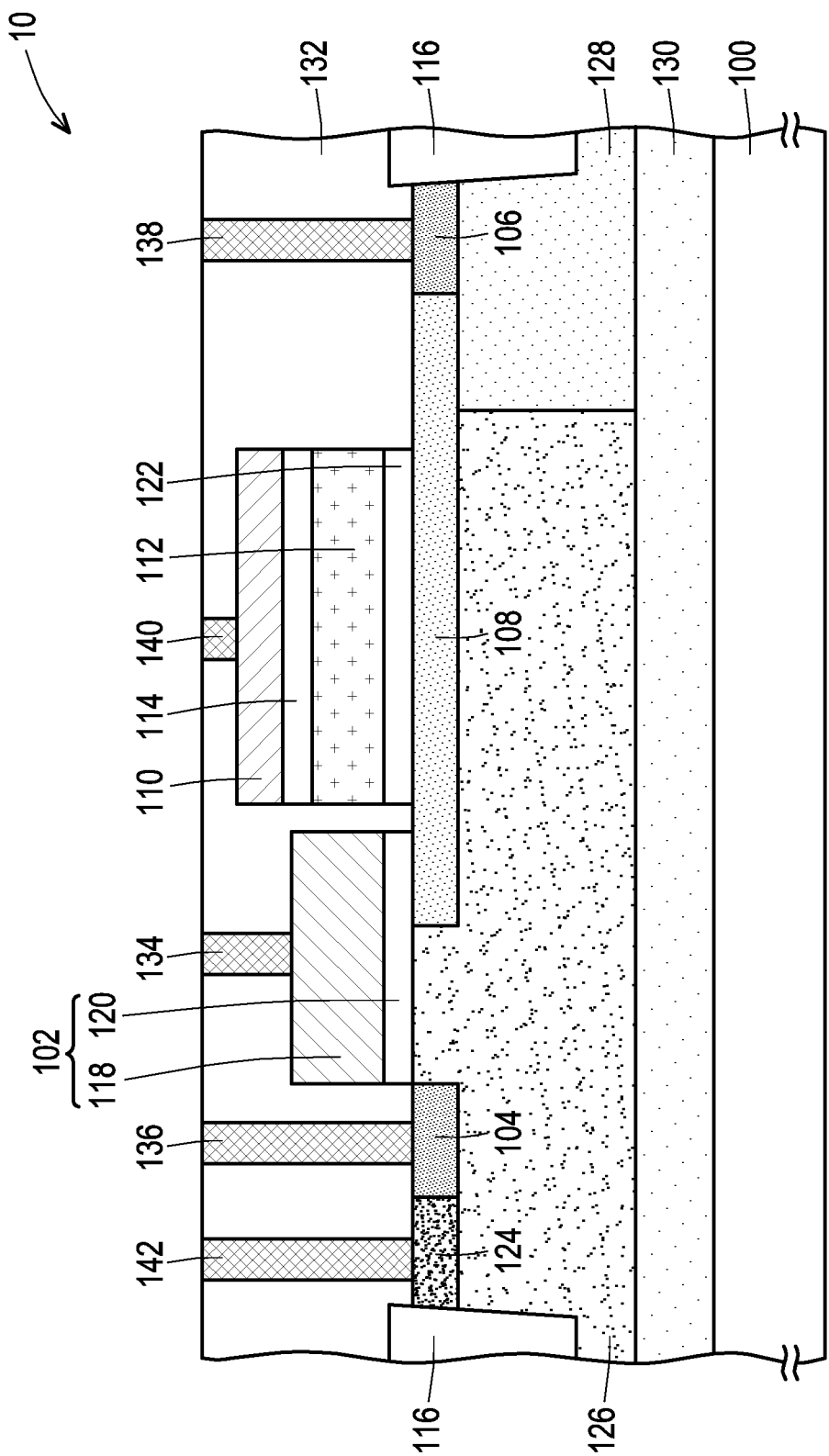
FIG. 1 is a cross-sectional view of a transistor structure according to some embodiments of the invention.
Figure 2:
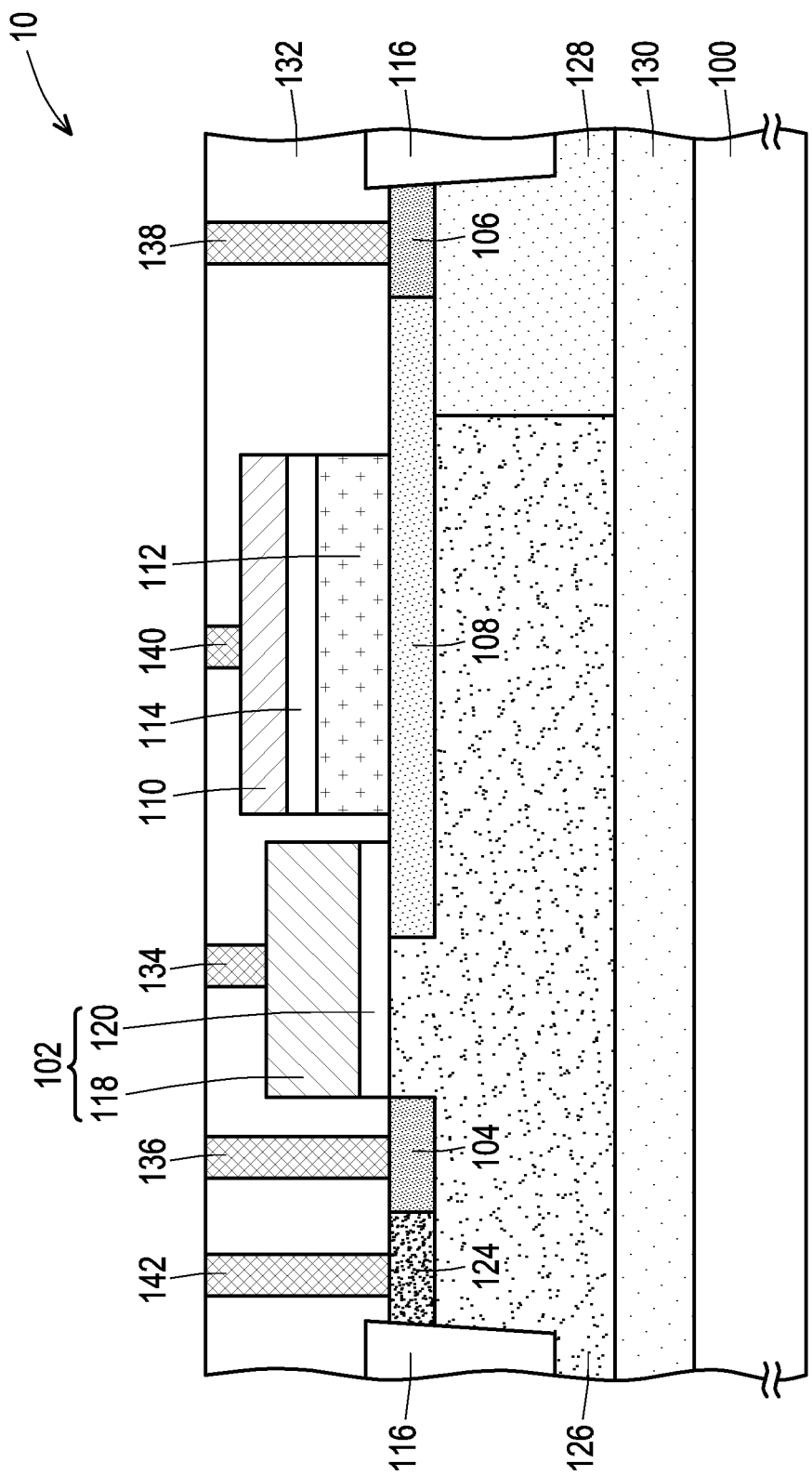
FIG. 2 is a cross-sectional view of a transistor structure according to other embodiments of the invention.

FIG. 1 is a cross-sectional view of a transistor structure according to some embodiments of the invention. FIG. 2 is a cross-sectional view of a transistor structure according to other embodiments of the invention.

Referring to FIG. 1, a transistor structure 10 includes a substrate 100, a gate structure 102, a doped region 104, a doped region 106, a drift region 108, a field plate 110, a charge storage layer 112, and a dielectric layer 114. In some embodiments, the transistor structure 10 may be a laterally diffused metal oxide semiconductor (LDMOS) transistor structure. The transistor structure 10 may be an NMOS transistor structure or a PMOS transistor structure. In the present embodiment, the transistor structure 10 is, for example, an NMOS transistor structure, but the invention is not limited thereto. In some embodiments, the substrate 100 may be a semiconductor substrate such as a silicon substrate. In some embodiments, the transistor structure 10 may further include an isolation structure 116. In some embodiments, the isolation structure 116 may be a shallow trench isolation (STI) structure. In some embodiments, the material of the isolation structure 116 is, for example, silicon oxide.

The gate structure 102 is located on the substrate 100. The gate structure 102 may include a gate 118 and a gate dielectric layer 120. The gate 118 is located on the substrate 100. In some embodiments, the material of the gate 118 is, for example, doped polysilicon. The gate dielectric layer 120 is located between the gate 118 and the substrate 100. In some embodiments, the material of the gate dielectric layer 120 is, for example, silicon oxide.

The doped region 104 and the doped region 106 are located in the substrate 100 on two sides of the gate structure 102. In some embodiments, the doped region 104 may be used as a source, and the doped region 106 may be used as a drain. In some embodiments, the doped region 104 may be closer to the gate structure 102 than the doped region 106. In some embodiments, the doped region 104 and the doped region 106 may have a first conductivity type (e.g., N-type).

Hereinafter, the first conductivity type and the second conductivity type may be one and the other of an N-type conductivity type and a P-type conductivity type, respectively. That is, the first conductivity type and the second conductivity type are different conductivity types. In the present embodiment, the first conductivity type may be an N-type conductivity type, and the second conductivity type may be a P-type conductivity type, but the invention is not limited thereto. In other embodiments, the first conductivity type may be a P-type conductivity type, and the second conductivity type may be an N-type conductivity type.

The drift region 108 is located in the substrate 100 between the gate structure 102 and the doped region 106. In some embodiments, a portion of the drift region 108 may be located directly below the gate structure 102. In some embodiments, the drift region 108 may be connected to the doped region 106. In some embodiments, the drift region 108 may have the first conductivity type (e.g., N type).

The field plate 110 is located on the substrate 100 above the drift region 108. In some embodiments, the field plate 110 may be located on the substrate 100 between the gate structure 102 and the doped region 106. In some embodiments, the material of the field plate 110 is, for example, copper or aluminum.

The charge storage layer 112 is located between the field plate 110 and the drift region 108. In some embodiments, the material of the charge storage layer 112 may be a charge trapping material or a floating gate material. In some embodiments, the charge trapping material is, for example, silicon nitride or a high-k dielectric material. In some embodiments, the floating gate material may be silicon material, such as doped polysilicon, undoped polysilicon, or a combination thereof.

In the present embodiment, the transistor structure 10 may further include a dielectric layer 122. The dielectric layer 122 is located between the charge storage layer 112 and the substrate 100. The dielectric layer 122 may be used to isolate the charge storage layer 112 from the substrate 100, but the invention is not limited thereto. In other embodiments, as shown in FIG. 2, the transistor structure 10 may not include the dielectric layer 122, and the charge storage layer 112 may be in direct contact with the substrate 100.

The dielectric layer 114 is located between the field plate 110 and the charge storage layer 112. The dielectric layer 114 may be used to isolate the field plate 110 from the charge storage layer 112. In some embodiments, the material of the dielectric layer 114 is, for example, silicon oxide.

The transistor structure 10 may further include a bulk region 124. The bulk region 124 is located in the substrate 100 on one side of the doped region 104 away from the gate structure 102. In some embodiments, the bulk region 124 may be connected to the doped region 104. In some embodiments, the bulk region 124 may have the second conductivity type (e.g., P-type).

The transistor structure 10 may further include a well region 126 and a well region 128. The well region 126 is located in the substrate 100. The well region 128 is located in the substrate 100 on one side of the well region 126. In some embodiments, the well region 126 may have the second conductivity type (e.g., P type), and the well region 128 may have the first conductivity type (e.g., N type). The doped region 104 may be located in the well region 126. The bulk region 124 may be located in the well region 126. The doped region 106 may be located in the well region 128. The drift region 108 may be located in the well region 126 and the well region 128. In some embodiments, the well region 128 may be connected to the well region 126. In some embodiments, the interface between the well region 126 and the well region 128 may be located in the substrate 100 between the field plate 110 and the doped region 106.

The transistor structure 10 may further include a well region 130. The well region 130 is located in the substrate 100. In some embodiments, the well region 126 and the well region 128 may be located in the well region 130. In some embodiments, the well region 130 may have the first conductivity type (e.g., N type). In some embodiments, the well region 130 may be a deep well region having the first conductivity type (e.g., deep N-type well (DNW) region).

The transistor structure 10 may further include a dielectric layer 132. The dielectric layer 132 is located on the substrate 100, the gate structure 102, the field plate 110, the charge storage layer 112, and the dielectric layer 114. In some embodiments, the material of the dielectric layer 132 is, for example, silicon oxide.

The transistor structure 10 may further include a contact 134, a contact 136, a contact 138, a contact 140, and a contact 142. The contact 134, the contact 136, the contact 138, the contact 140, and the contact 142 are located in the dielectric layer 132. The contact 134, the contact 136, the contact 138, the contact 140, and the contact 142 may be electrically connected to the gate 118, the doped region 104, the doped region 106, the field plate 110, and the bulk region 124, respectively. In some embodiments, the materials of the contact 134, the contact 136, the contact 138, the contact 140, and the contact 142 are, for example, tungsten, titanium, titanium nitride, or a combination thereof.

In some embodiments, the gate 118, the doped region 104, the doped region 106, the field plate 110, and the bulk region 124 may be electrically connected to different voltage sources, but the invention is not limited thereto. In other embodiments, the gate 118 and the field plate 110 may be electrically connected to each other by interconnection structures (e.g., the contact 134, the contact 140, and other interconnection structure (not shown)), and the gate 118 and the field plate 110 may be electrically connected to the same voltage source. In other embodiments, the doped region 104 and the bulk region 124 may be electrically connected to each other by interconnection structures (e.g., the contact 136, the contact 142, and other interconnection structure (not shown)), and the doped region 104 and the bulk region 124 may be electrically connected to the same voltage source.

Based on the above embodiments, in the transistor structure 10, the charge storage layer 112 is located between the field plate 110 and the drift region 108. Therefore, the charge storage layer 112 can be negative potential by a program operation. In addition, the charge storage layer 112 can be positive potential by an erase operation. In some embodiments, when the transistor structure 10 is an NMOS transistor structure and the charge storage layer 112 is negative potential, the breakdown voltage of the transistor structure 10 can be increased. For example, when the transistor structure 10 is an NMOS transistor structure, a voltage of 0 volt is applied to the contact 138, and a positive voltage is applied to the contact 140, the electrons will be injected from the drift region 108 into the charge storage layer 112 (program operation), so that the charge storage layer 112 is negative potential. At this time, the drift region 108 will be affected by the electric field of negative charge at the charge storage layer 112, so that the drift region 108 has a higher voltage drop, that is, the breakdown voltage can be increased. In some embodiments, when the transistor structure 10 is an NMOS transistor structure and the charge storage layer 112 is positive potential, the on-current of the transistor structure 10 can be increased or the on-resistance of the transistor structure 10 can be reduced. For example, when the transistor structure 10 is an NMOS transistor structure, a voltage of 0 volt is applied to the contact 138, and a negative voltage is applied to the contact 140, the electrons will be released at the charge storage layer 112 (erase operation), so that the charge storage layer 112 is positive potential. At this time, the drift region 108 will be affected by the electric field of positive charge at the charge storage layer 112, so that the drift region 108 has a lower resistance, that is, the on-current can be increased. In some embodiments, when the transistor structure 10 is a PMOS transistor structure and the charge storage layer 112 is negative potential, the on-current of the transistor structure 10 can be increased or the on-resistance of the transistor structure 10 can be reduced. In some embodiments, when the transistor structure 10 is a PMOS transistor structure and the charge storage layer 112 is positive potential, the breakdown voltage of the transistor structure 10 can be increased. In this way, the electrical performance of the transistor structure 10 can be improved by the charge storage layer 112. On the other hand, the transistor structure 10 can be switched between the higher breakdown mode and the higher on-current mode.

In summary, since the transistor structure of the aforementioned embodiments has a charge storage layer, the transistor structure can have better electrical performance (e.g., higher breakdown voltage or higher on-current). In addition, the transistor structure can be switched between the higher breakdown mode and the higher on-current mode.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:
1. A transistor structure, comprising:
a substrate;
a gate structure located on the substrate;
a first doped region and a second doped region located in the substrate on two sides of the gate structure;
a drift region located in the substrate between the gate structure and the second doped region;
a field plate located on the substrate above the drift region;

a charge storage layer located between the field plate and the drift region;
a first dielectric layer located between the field plate and the charge storage layer;
a first well region located in the substrate; and
a second well region located in the substrate on one side of the first well region, wherein
the first doped region is located in the first well region,
the second doped region is located in the second well region, and
the drift region is located in the first well region and the second well region.

2. The transistor structure according to claim 1, further comprising:
a second dielectric layer located between the charge storage layer and the substrate.

3. The transistor structure according to claim 1, wherein the charge storage layer is in direct contact with the substrate.

4. The transistor structure according to claim 1, wherein a material of the charge storage layer comprises a charge trapping material or a floating gate material.

5. The transistor structure according to claim 4, wherein the charge trapping material comprises silicon nitride or a high dielectric constant material.

6. The transistor structure according to claim 4, wherein the floating gate material comprises doped polysilicon, undoped polysilicon, or a combination thereof.

7. The transistor structure according to claim 1, wherein the gate structure comprises:
a gate located on the substrate; and
a gate dielectric layer located between the gate and the substrate.

8. The transistor structure according to claim 1, wherein the field plate is located on the substrate between the gate structure and the second doped region.

9. The transistor structure according to claim 1, wherein a material of the field plate comprises copper or aluminum.

10. The transistor structure according to claim 1, wherein a portion of the drift region is located directly below the gate structure.

11. The transistor structure according to claim 1, wherein the drift region is connected to the second doped region.

12. The transistor structure according to claim 1, further comprising:
a bulk region located in the substrate on one side of the first doped region away from the gate structure.

13. The transistor structure according to claim 12, wherein the bulk region is connected to the first doped region.

14. The transistor structure according to claim 12, wherein the first doped region has a first conductivity type, and the bulk region has a second conductivity type.

15. The transistor structure according to claim 1, wherein the second well region is connected to the first well region.

16. The transistor structure according to claim 1, wherein an interface between the first well region and the second well region is located in the substrate between the field plate and the second doped region.

17. The transistor structure according to claim 1, further comprising:
a third well region located in the substrate, wherein the first well region and the second well region are located in the third well region.

18. The transistor structure according to claim 17, wherein the first doped region, the second doped region, the drift region, the second well region, and the third well region have a first conductivity type, and the first well region has a second conductivity type.

19. The transistor structure according to claim 1, further comprising:
a second dielectric layer located on the substrate, the gate structure, the field plate, the charge storage layer, and the first dielectric layer.

* * * * *